(12) United States Patent
Aoki et al.

(10) Patent No.: US 6,229,188 B1
(45) Date of Patent: May 8, 2001

(54) MOS FIELD EFFECT TRANSISTOR AND ITS MANUFACTURING METHOD

(75) Inventors: Kenji Aoki; Ryoji Takada, both of Tokyo (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 08/538,980

(22) Filed: Oct. 5, 1995

Related U.S. Application Data

(63) Continuation of application No. 08/441,656, filed on May 15, 1995, now abandoned, which is a continuation of application No. 08/216,764, filed on Mar. 22, 1994, now abandoned, which is a continuation of application No. 08/132,485, filed on Oct. 6, 1993, now abandoned, which is a continuation of application No. 08/058,048, filed on May 5, 1993, now abandoned, which is a continuation of application No. 07/938,499, filed on Aug. 31, 1992, now abandoned, which is a continuation of application No. 07/140,652, filed on Jan. 4, 1988, now abandoned.

(30) Foreign Application Priority Data

| | | | |
|---|---|---|---|
| Jan. 5, 1987 | (JP) | ................................................ | 62-000321 |
| Jan. 16, 1987 | (JP) | ................................................ | 62-000755 |
| Jan. 21, 1987 | (JP) | ................................................ | 62-011861 |
| Feb. 19, 1987 | (JP) | ................................................ | 62-036618 |
| Feb. 19, 1987 | (JP) | ................................................ | 62-119543 |
| Apr. 21, 1987 | (JP) | ................................................ | 62-097960 |

(51) Int. Cl.$^7$ .......................... H01L 29/76; H01L 29/94; H01L 31/062; H01L 31/113
(52) U.S. Cl. .......................... 257/404; 257/402; 257/403
(58) Field of Search ......................... 357/23.12; 257/402, 257/403, 404

(56) References Cited

FOREIGN PATENT DOCUMENTS 56-94670 * 7/1981 (JP) ......................................... 357/42

* cited by examiner

Primary Examiner—Ngân V. Ngô
(74) Attorney, Agent, or Firm—Adams & Wilks

(57) ABSTRACT

The present invention provides novel structures of MOS field effect transistor which operate with high speed and low power consumption. This has been achieved through providing epitaxial growth layers on a substrate of high impurity doping concentration in which the thickness of epitaxial growth layers is controlled with a degree of accuracy on the order of a single atom layer.

22 Claims, 9 Drawing Sheets

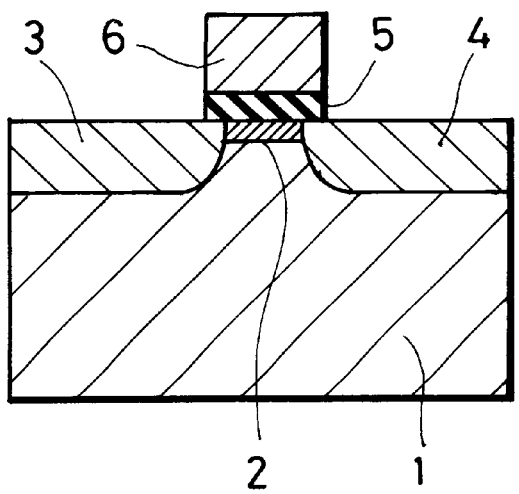
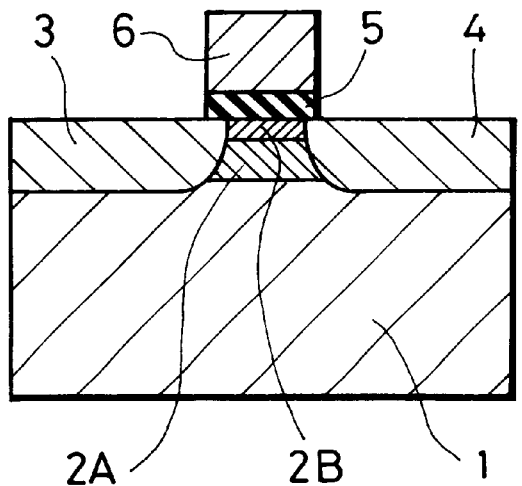
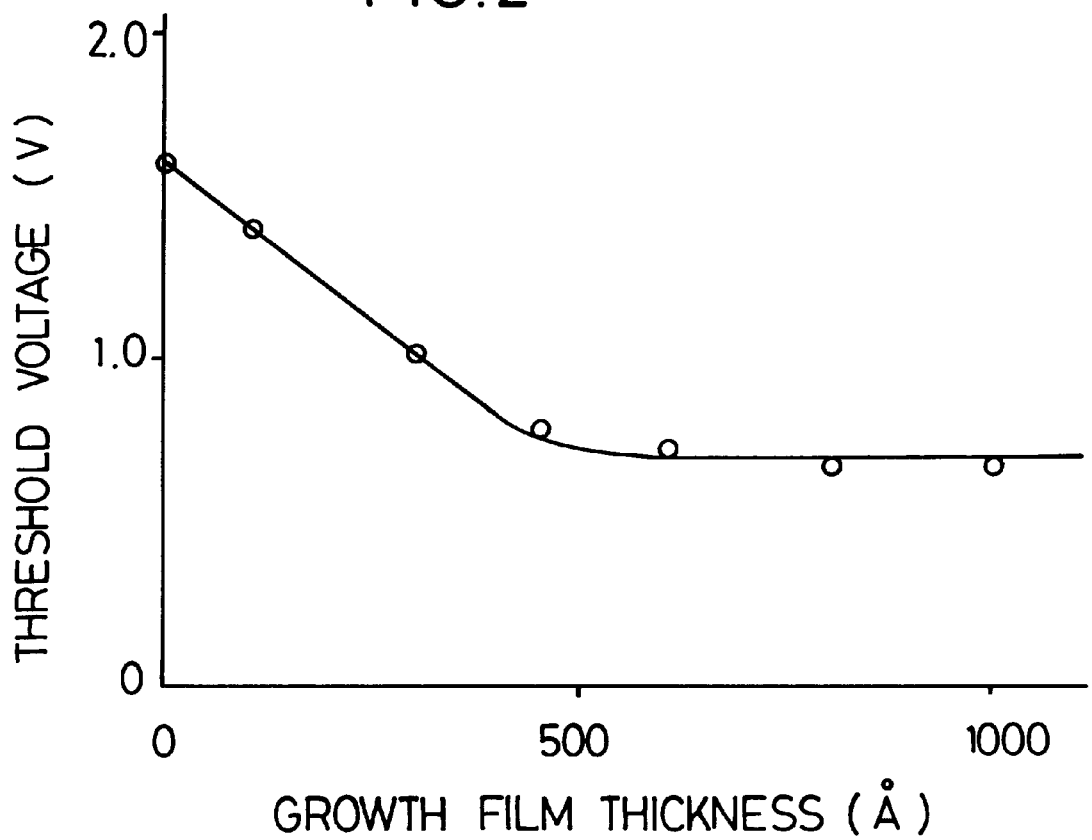

MOS FIELD EFFECT TRANSISTOR AND ITS MANUFACTURING METHOD

This is a continuation of application Ser. No. 08/441,656 filed May 15, 1995 which is a continuation of application Ser. No. 08/216,764 filed Mar. 22, 1994 which is a continuation of application Ser. No. 08/132,485 filed Oct. 6, 1993 which is a continuation of application Ser. No. 08/058,048 filed May 5, 1993 which is a continuation of application Ser. No. 07/938,499 filed Aug. 31, 1992 which is a continuation of application Ser. No. 07/140,652 filed Jan. 4, 1988 all are abandoned.

BACKGROUND OF THE INVENTION

1. Field of the Invention

The present invention relates to a MOS field effect transistor (hereinafter referred to as MOSFET) that operates with low power consumption and at a high speed and which can be, used as a memory device and a switching device in computers. It also relates to the manufacturing method of the MOSFET of the present invention.

2. Prior Arts

Miniaturization of a MOSFET faces difficult problems such as short channel effects in particular. This phenomenon is characterized by lowered threshold voltage. For a given channel doping concentration, as the channel length is reduced, the depletion layer extending towards the gate becomes to serve as an additional depletion layer to the depletion layer at the drain electrode and subsequently reduces the depletion layer at the gate, which eventually lowers the threshold voltage of the device. In addition to this phenomenon, there is a problem in a CMOS structure of latch-up which is a parasitic bipolar action. One approach to avoid latch-up is to increase the impurity concentration of the substrate thereby reducing the resistance of the substrate. However, if the impurity concentration is increased to such a level as to prevent the latch-up, the threshold voltage increases to an undesirable level. Also, if the impurity concentration in the channel region where carriers traverse is high, the effect of scattering by the impurity atoms increases generally resulting in lowered carrier mobility.

SUMMARY OF THE INVENTION

The object of the invention therefore is to solve the problems accompanied with such conventional devices as described hereinabove. In accordance with the invention, a substrate of high impurity doping concentration is used to prevent short channel effects and latch-up, and an epitaxial growth layer with low impurity doping concentration is provided at the channel region to obtain high operation speed and to control threshold voltage.

BRIEF DESCRIPTION OF THE DRAWINGS

FIG. 1A illustrates a cross-section of a MOSFET according to the invention in which the channel region comprises one type of epitaxial growth layer, FIG. 1B illustrates a cross-section of a MOSFET according to the invention in which two epitaxial growth layers of different thickness, impurity concentration and opposite conductivity to each other are formed at the channel region, FIG. 2 shows the threshold-dependence on epitaxial growth layer thickness of a MOSFET of the invention.

DETAILED DESCRIPTION OF PREFERRED EMBODIMENTS

The present invention is hereunder described in detail with reference to preferred embodiments thereof. FIG. 1A and FIG. 1B show cross-sections of MOSFETs manufactured according to the invention. FIG. 1A shows a cross-section of a MOSFET in which on a substrate 1 of high impurity doping concentration an epitaxial growth layer 2 having an impurity doping concentration lower than that of the substrate is formed. A MOSFET shown in FIG. 1B has two epitaxial growth layers of different impurity doping concentration and different thickness provided on a substrate 1 of high impurity doping concentration. This structure provides a buried channel type device. The first epitaxial growth layer 2A has an impurity doping concentration lower than that of the substrate. The impurity of the second epitaxial growth layer 2B has a conductivity type opposite to that of the substrate and an impurity doping concentration higher than that of the first epitaxial layer. In both cases, the thickness of the epitaxial growth layer or layers is the same or less than the thickness of a depletion region at a channel region of the transistor.

FIG. 2 shows the threshold dependence on epitaxial growth film thickness of a MOSFET shown in FIG. 1A. In the case of the MOSFET shown in FIG. 2, the impurity doping concentration of the substrate is $1 \times 10^{17}$ cm$^{-3}$, that of the epitaxial growth layer is $1 \times 10^{14}$ cm$^{-3}$, and the gate length is 1 $\mu$m. It is estimated from FIG. 2 that the thickness of the depletion layer formed in the channel region is about 500 Å.

Figure 3:
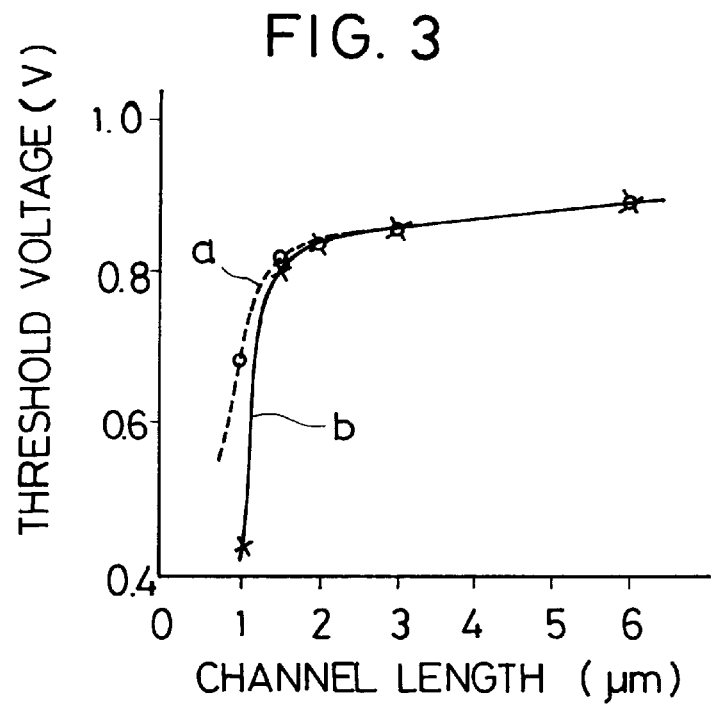
FIG. 3 shows the threshold-dependence on channel length of a MOSFET of the invention and a conventional MOSFET.

FIG. 3 shows the threshold-dependence on channel length of a MOSFET according to the present invention (curve a) and that of a conventional MOSFET manufactured with a substrate of impurity doping concentration of $3 \times 10^{16}$ cm$^{-3}$. The MOSFET according to the invention (curve b) shown in FIG. 3 (curve a) has at its channel region an epitaxial growth layer whose thickness is 300 Å and an impurity doping concentration of $1 \times 10^{14}$ cm$^{-3}$. This layer is formed on a substrate having an impurity doping concentration of $1 \times 10^{18}$ cm$^{-3}$. The layer is formed through the use of molecular layer epitaxy or molecular beam epitaxy. The curve a shows threshold-dependence on channel length of the type of a MOSFET according to the invention shown in FIG. 1A, and the curve b the conventional MOSFET. It is clearly seen from FIG. 3 that the MOSFET of the present invention is excellent in preventing short channel effects compared with conventional MOSFETs.

Figure 4:
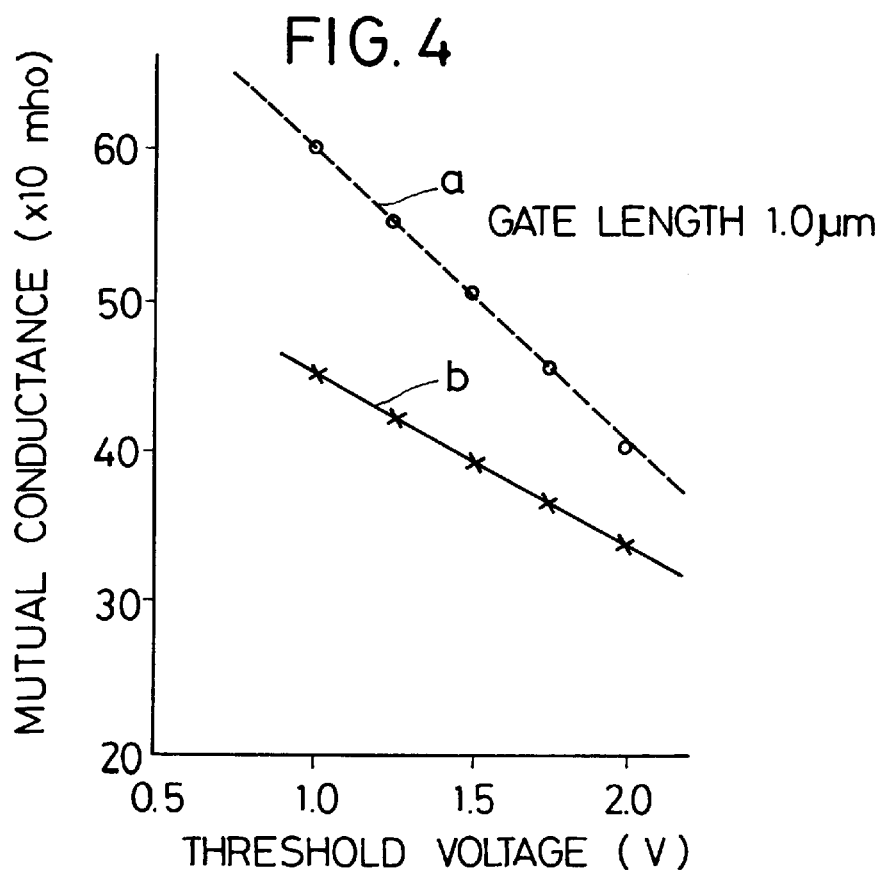
FIG. 4 shows the transconductance-dependence on threshold voltage of MOSFETs shown in FIG. 3, FIGS. 5A–FIG. 5J show a manufacturing process of a MOSFET in which a source region and a drain region are formed by ion implantation, and thereafter a channel region is formed by selective epitaxy.

FIG. 4 shows transconductance-dependence on threshold voltage of a MOSFET of the invention (line a ) shown in FIG. 1A and a conventional MOSFET (line b). It is clearly observed from FIG. 4 that a MOSFET of the invention has a carrier mobility more than 20% higher than that of a conventional one at a given threshold voltage.

Figure 5A:
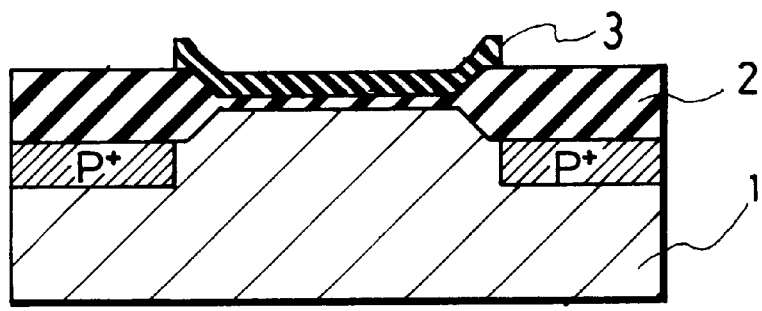
Figure 5B:
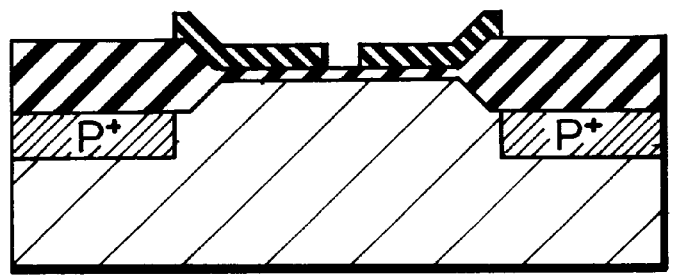
Figure 5C:
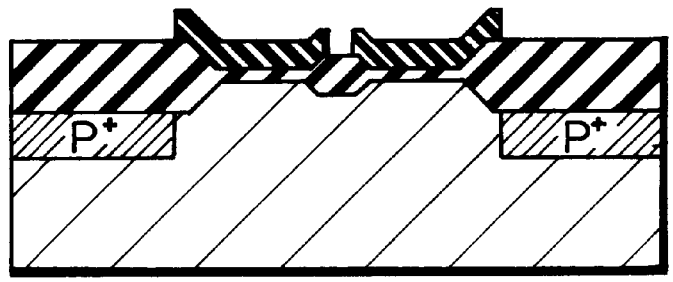
Figure 5D:
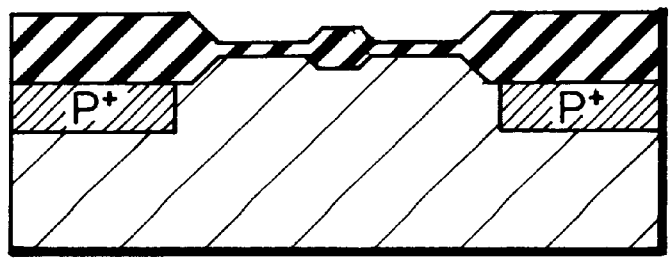
Figure 5E:
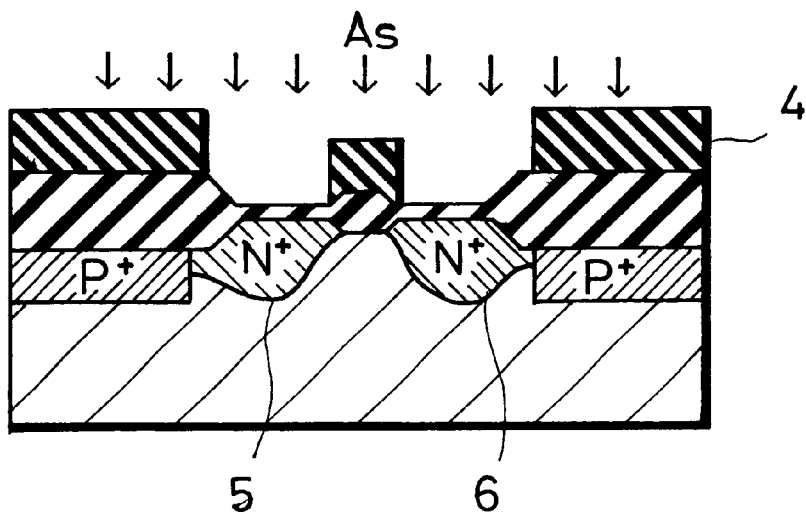
Figure 5F:
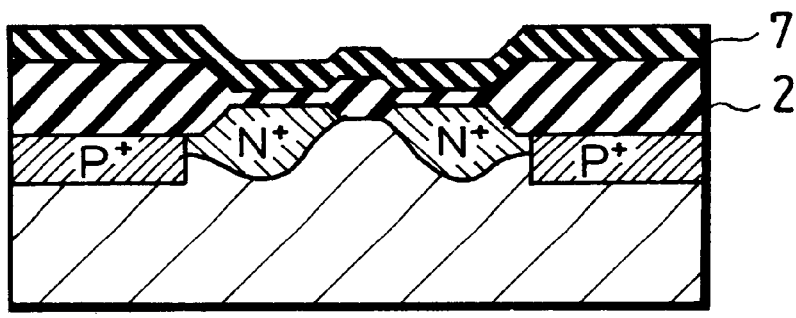
Figure 5G:
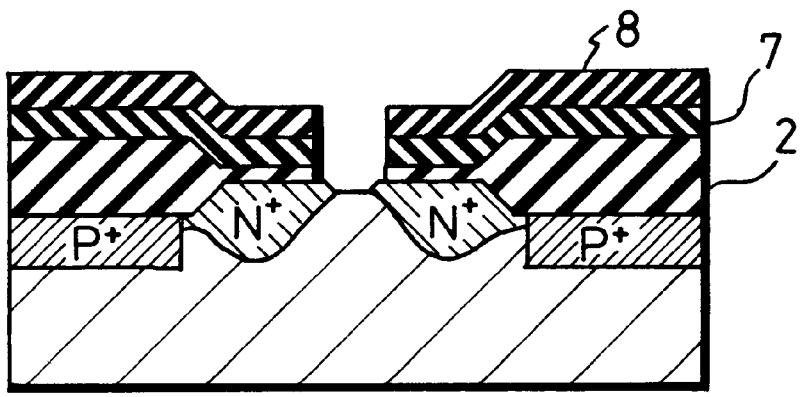
Figure 5H:
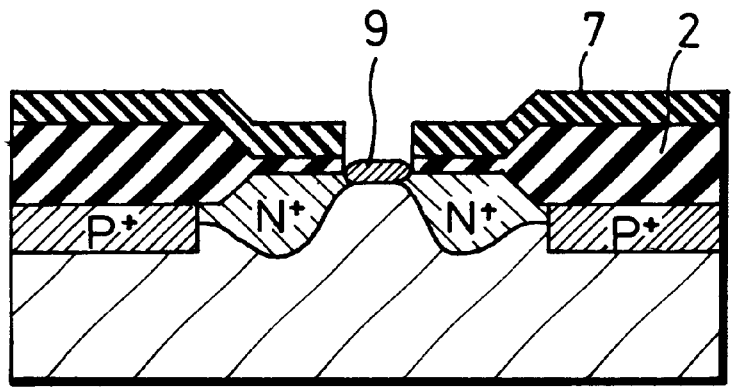
Figure 5I:
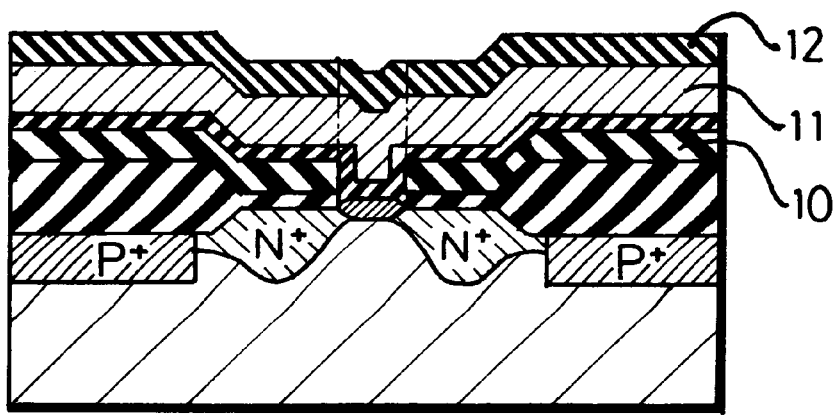
Figure 5J:
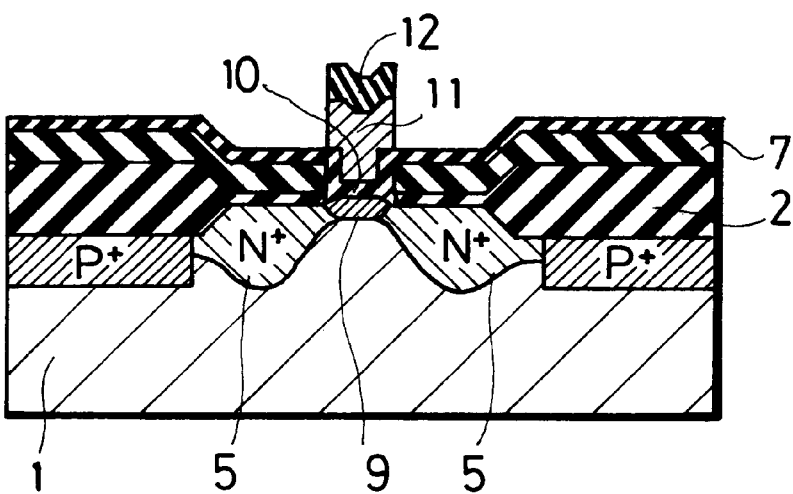

FIGS. 5A to 5J illustrate a manufacturing process of the MOSFET of the invention in which a source and a drain region are formed by ion implantation prior to formation of a channel region. This MOSFET is characterized by the structure in which the channel region is partially curved down into the substrate surface. FIG. 5A shows a cross-section of a conventional LOCOS (Local Oxidation of Silicon). A field oxide film 2 of about 6000 Å thickness and a silicon nitride film 3 of about 3000 Å thickness are formed on a substrate. The silicon nitride film on a channel forming region is partially etched away as shown in FIG. 5B. Thermal oxidation is carried out to form a field oxide film of about 9000 Å thickness and an oxide film of about 3000 Å thickness at the channel forming region as shown in FIG. 5C. FIG. 5D shows a step in which the silicon nitride film is removed. After resist pattern 4 is formed as shown in FIG. 5E, Arsenic (As) is ion-implanted and annealing is carried out at about 900° C. to form a source 5 and a drain 6. A CVD oxide film 7 of about 3000 Å is deposited as shown in FIG. 5F. By using photo resist all the oxide films at the channel forming region are removed as shown in FIG. 5G. Using the oxide film as a mask, an epitaxial growth layer 9 is selectively deposited as shown in FIG. 5H. The temperature of the substrate during this epitaxial growth is about 800° C., the epitaxial growth layer is grown by the thickness of about 1500 Å, and the impurity doping concentration is about $1\times10^{13}$ cm$^{-3}$. As shown in FIG. 5I, a gate oxide film 10 of about 200 Å thickness is formed by using CVD method at the substrate temperature of 700° C., thereafter an impurity doped poly-silicon 11 is deposited thereon at the substrate temperature of 750° C. All the poly-silicon film except for an area at the gate region is removed as shown in FIG. 5J. The MOSFET fabricated in the manner described hereabove can have a channel region completely free of damages by ion-implantation and without impurity auto-doping from the substrate.

Figure 6A:
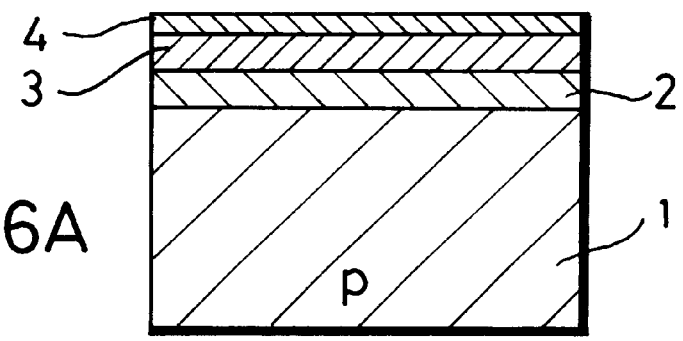
FIGS. 6A–FIG. 6C show a manufacturing process of a MOSFET in which three epitaxial growth layers of different thickness and impurity concentration are formed on a substrate.
Figure 6B:
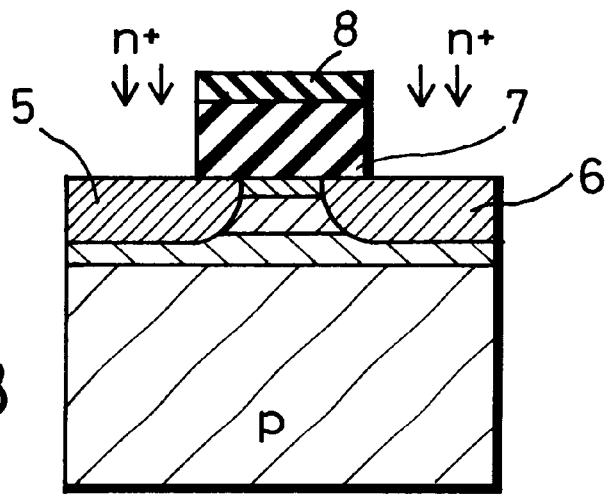
Figure 6C:
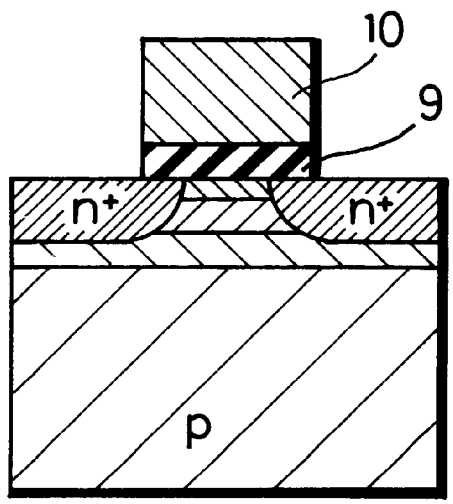
Figure 7:
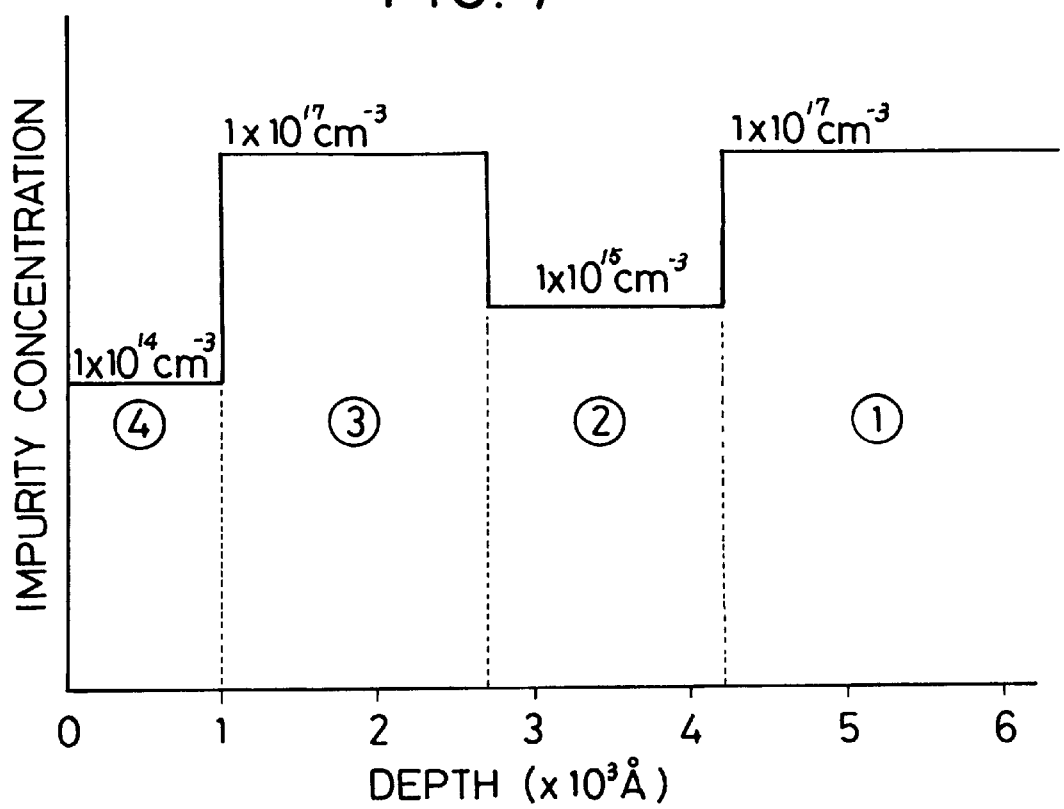
FIG. 7 shows the vertical impurity doping profile of the epitaxial growth layer shown in FIG. 6A.

FIGS. 6A to 6C show a manufacturing process of a MOSFET having a structure in which three epitaxial growth layers of different impurity doping concentration and thickness are provided on a substrate. As shown in FIG. 6A, 1st, 2nd and 3rd epitaxial growth layers 2,3 and 4 are successively deposited on a substrate 1 of high impurity concentration. FIG. 6B shows a step in which a source 5 and a drain 6 are formed by ion implantation using a CVD oxide film 7 and a resist 8 as masks. After completing ion implantation, the CVD oxide film 7 and resist 8 are removed, and thereafter a gate oxide film 9 and a gate 10 are provided as shown in FIG. 6C. FIG. 7 shows the impurity doping profile and the thickness of the epitaxial growth layers shown in FIG. 6A; the first epitaxial growth layer 2 has a thickness of 1500 Å and an impurity doping concentration of $1\times10^{15}$ cm$^{-3}$, the second epitaxial growth layer 3 respectively 1700 Å and $1\times10^{15}$ cm$^{-3}$, and the third epitaxial growth layer 4 respectively 1000 Å and $1\times10^{14}$ cm$^{-3}$.

Figure 8A:
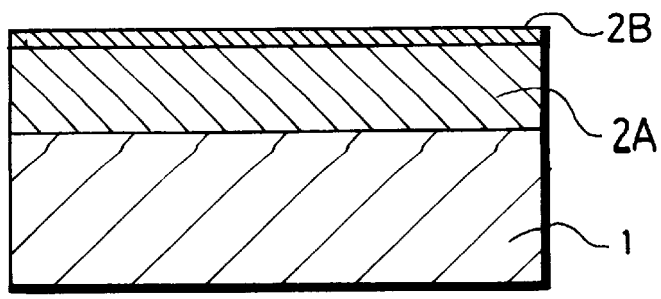
FIG. 8 shows a manufacturing process of a MOSFET having two different epitaxial growth layers.
Figure 8B:
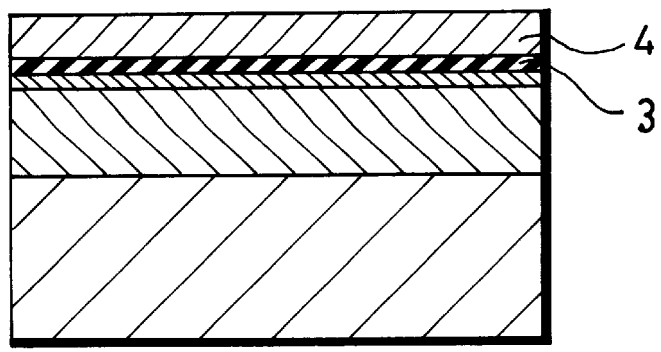
Figure 8C:
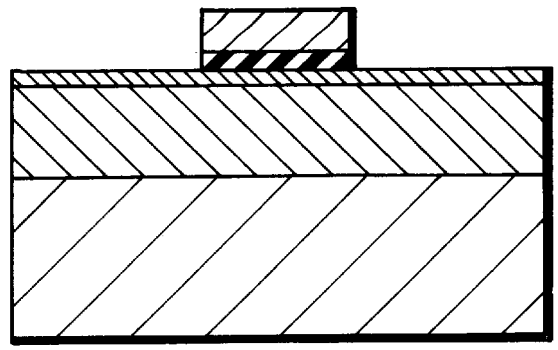
Figure 8D:
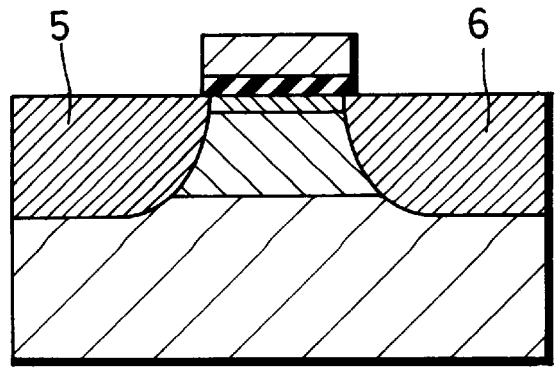

FIGS. 8A to FIG. 8D show a process of manufacturing a MOSFET having two epitaxial growth layers of different thickness and impurity concentration in the form shown in FIG. 1B. FIG. 8A shows a step in which two epitaxial growth layers 2A and 2B are formed on a substrate 1 of high impurity doping concentration while controlling impurity doping concentration of the layers. This process employs molecular layer epitaxy which is carried out at a substrate temperature of 850° C. or less. The impurity doping concentration of the substrate 1 is $1\times10^{18}$ cm$^3$. The first epitaxial growth layer 2A has an impurity doping concentration of $1\times10^{13}$ cm$^{-3}$ and a thickness of 3000 Å. The second epitaxial growth layer 2B has an impurity doping concentration of $1\times10^{16}$ cm$^{-3}$ and a thickness of 500 Å. A gate oxide film 3 and a poly-silicon for a gate 4 are deposited using the CVD method as shown in FIG. 8B. In FIG. 8C the gate 4 is provided by patterning with the use of a photo-resist. A source 5 and a drain 6 are formed by ion-implantation using the gate portion as a mask as shown in FIG. 8D.

Figure 9:
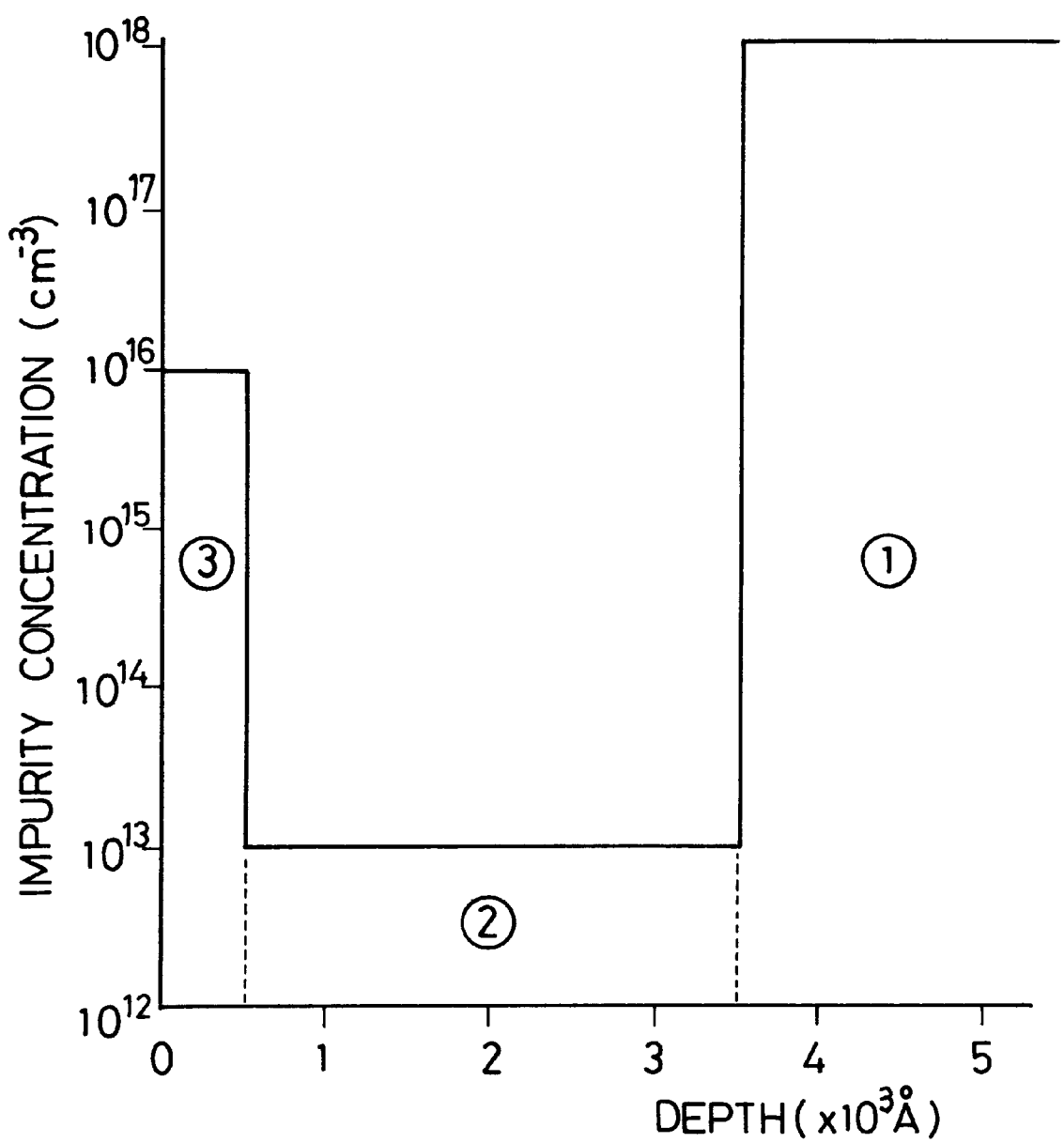
FIG. 9 shows the vertical impurity doping profile of the channel region of the MOSFET shown in FIG. 8.

FIG. 9 shows the vertical impurity doping profile at the channel region of a MOSFET fabricated in the process as described above. Numeral 1 in FIG. 9 is the substrate of high impurity doping concentration, numeral 2 is the first epitaxial growth layer and numeral 3 is the second epitaxial growth layer. A MOSFET fabricated according to the process as described above has a structure in which the junction capacitance between the substrate and the source and drain is small, and the short channel effects are prevented. MOSFETs fabricated according to the invention are very effective in preventing latch-up and short channel effects. Moreover, a high performance in both static and dynamic characteristic which is not possible by conventional devices can be obtained. The present invention provides a novel structure of semiconductor device and its manufacturing method which are highly effective in the improvement of semiconductor device performance.

We claim:

1. A MOS field effect transistor comprising: a semiconductor substrate; and an epitaxially grown layer provided on said substrate, the impurity concentration of said epitaxially grown layer being lower than that of said substrate, and the thickness of said epitaxially grown layer being the same as or less than the thickness of a depletion region at a channel region of the transistor.

2. The MOS field effect transistor according to claim 1; wherein said semiconductor substrate has an impurity doping concentration of $1\times10^{17}$ cm$^{-3}$ or more.

3. The MOS field effect transistor according to claim 1; wherein said epitaxially grown layer comprises at least two epitaxially grown layers of different impurity doping concentrations and thicknesses.

4. A MOS field effect transistor comprising: a semiconductor substrate having a predefined channel-forming region and having a given impurity concentration; and an epitaxially grown layer grown on the semiconductor substrate over the channel-forming region, the epitaxially grown layer having an impurity concentration lower than that of the semiconductor substrate and having a thickness not greater than that of a depletion region at the channel region.

5. A MOS field effect transistor according to claim 4; wherein the semiconductor substrate has an impurity concentration of $1\times10^{17}$ cm$^{-3}$ or more.

6. A MOS field effect transistor according to claim 5; wherein the epitaxially grown layer comprises at least two epitaxially grown layers having different impurity concentrations and different thicknesses.

7. A MOS field effect transistor according to claim 6; wherein the at least two epitaxially grown layers include a first epitaxially crown layer grown on the semiconductor substrate and having an impurity concentration lower than that of the semiconductor substrate, and a second epitaxially grown layer grown on the first epitaxial growth layer and having an impurity concentration higher than that of the first epitaxially grown layer.

8. A MOS field effect transistor according to claim 7; wherein the thickness of the second epitaxially grown layer is not greater than 500 Å.

9. A MOS field effect transistor according to claim 4; wherein the epitaxially grown layer comprises at least two epitaxially grown layers having different impurity concentrations and different thicknesses.

10. A MOS field effect transistor according to claim 9; wherein the at least two epitaxially grown layers include a first epitaxially grown layer grown on the semiconductor substrate and having an impurity concentration lower than that of the semiconductor substrate, and a second epitaxially grown layer grown on the first epitaxially grown layer and having an impurity concentration higher than that of the first epitaxially grown layer.

11. A MOS field effect transistor according to claim 10; wherein the thickness of the second epitaxially grown layer is not greater than 500 Å.

12. The MOS field effect transistor according to claim 1; wherein the epitaxial growth layer has an impurity doping concentration on the order of $1 \times 10^{13}$ cm$^{-3}$.

13. The MOS field effect transistor according to claim 1; wherein the epitaxial growth layer has an impurity doping concentration on the order of $1 \times 10^{14}$ cm$^{-3}$.

14. The MOS field effect transistor according to claim 13; wherein the semiconductor substrate has an impurity doping concentration of $1 \times 10^{18}$ cm$^{-3}$.

15. A MOSFET comprising: a semiconductor substrate; a source region formed in the semiconductor substrate; a drain region formed in the semiconductor substrate spaced apart from the source region; a gate electrode formed over the semiconductor substrate between the source region and the drain region; a thin film layer formed on the semiconductor substrate between the source region and the drain region; and a channel region formed between the source region and the drain region including a depletion region formed in the thin film region in response to the application of a voltage to the gate electrode; wherein the thin film layer has an impurity concentration lower than that of the substrate and a thickness no greater than that of the depletion region, such that a threshold of the MOSFET may be controlled by selecting the thickness of the thin film layer to avoid short channel effects.

16. A MOSFET according to claim 15; wherein the thin film layer comprises an epitaxially grown layer.

17. A MOSFET according to claim 15; wherein the semiconductor substrate has an impurity concentration of at least $1 \times 10^{17}$ cm$^{-3}$.

18. A MOSFET according to claim 15; wherein the thin film layer comprises at least two epitaxially grown thin film layers each having a different impurity concentration.

19. A MOSFET according to claim 18; wherein the at least two epitaxially grown thin film layers includes a first epitaxially grown thin film layer formed on the semiconductor substrate and having an impurity concentration lower than that of the semiconductor substrate, and a second epitaxially grown thin film layer formed on the first epitaxially grown thin film layer and having an impurity concentration higher than that of the first epitaxially grown thin film layer.

20. A MOSFET according to claim 19; wherein the thickness of the second epitaxially grown thin film layer is no greater than approximately 500 angstroms.

21. A MOSFET according to claim 15; wherein the thin film layer has an impurity concentration of approximately $1 \times 10^{14}$ cm$^{-3}$.

22. A MOSFET according to claim 21; wherein the semiconductor substrate has an impurity concentration of approximately $1 \times 10^{18}$ cm$^{-3}$.

* * * * *